(12) United States Patent
Park

(10) Patent No.: US 11,972,995 B2
(45) Date of Patent: Apr. 30, 2024

(54) SEMICONDUCTOR PACKAGE AND METHOD OF MANUFACTURING SEMICONDUCTOR PACKAGE

(71) Applicant: Samsung Electronics Co., Ltd., Suwon-si (KR)

(72) Inventor: Dahee Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/301,564

(22) Filed: Apr. 17, 2023

(65) Prior Publication Data

US 2023/0253282 A1 Aug. 10, 2023

Related U.S. Application Data

(63) Continuation of application No. 17/357,184, filed on Jun. 24, 2021, now Pat. No. 11,658,086.

(30) Foreign Application Priority Data

Nov. 25, 2020 (KR) ........................ 10-2020-0160076

(51) Int. Cl.
- *H01L 23/31* (2006.01)
- *H01L 23/00* (2006.01)
- *H01L 25/00* (2006.01)
- *H01L 25/065* (2023.01)
- *H01L 25/18* (2023.01)
- *H01L 23/14* (2006.01)

(Continued)

(52) U.S. Cl.
CPC ........ *H01L 23/3185* (2013.01); *H01L 23/564* (2013.01); *H01L 25/0655* (2013.01); *H01L 25/18* (2013.01); *H01L 25/50* (2013.01); *H01L 23/147* (2013.01); *H01L 23/3675* (2013.01); *H01L 23/49827* (2013.01); *H01L 24/16* (2013.01); *H01L 24/32* (2013.01); *H01L 24/73* (2013.01); *H01L 2224/16145* (2013.01); *H01L 2224/32145* (2013.01); *H01L 2224/73204* (2013.01)

(58) Field of Classification Search
CPC . H01L 23/3185; H01L 23/564; H01L 23/147; H01L 23/3675; H01L 23/49827; H01L 24/16; H01L 24/32; H01L 24/73; H01L 25/0655; H01L 25/18; H01L 25/50; H01L 2224/16145; H01L 2224/32145; H01L 2224/73204

See application file for complete search history.

(56) References Cited

U.S. PATENT DOCUMENTS

| | | |
|---|---|---|
| 8,502,400 B2 | 8/2013 | Karpur et al. |
| 9,627,329 B1 | 4/2017 | Kwon et al. |
| 10,438,863 B1 | 10/2019 | Boja et al. |

(Continued)

*Primary Examiner* — Peniel M Gumedzoe
(74) *Attorney, Agent, or Firm* — Myers Bigel, P.A.

(57) ABSTRACT

A semiconductor package includes a package substrate, an interposer on the package substrate, a plurality of semiconductor devices on the interposer and spaced apart from each other, the semiconductor devices being electrically connected to the interposer, a dam structure on the interposer extending along a peripheral region of the interposer, the dam structure being spaced apart from the semiconductor devices, and a stress relief on the interposer, the stress relief including an elastic member that fills gaps between the semiconductor devices and the dam structure.

20 Claims, 22 Drawing Sheets

(51) Int. Cl.
　　　*H01L 23/367*　　　(2006.01)
　　　*H01L 23/498*　　　(2006.01)

(56) References Cited

U.S. PATENT DOCUMENTS

| | | |
|---|---|---|
| 2007/0120268 A1 | 5/2007 | Irsigler et al. |
| 2008/0093733 A1 | 4/2008 | Hsu |
| 2012/0049355 A1 | 3/2012 | Hosokawa et al. |
| 2012/0098123 A1 | 4/2012 | Yu et al. |
| 2012/0159118 A1 | 6/2012 | Wong et al. |
| 2014/0160688 A1 | 6/2014 | Lu et al. |
| 2017/0103906 A1* | 4/2017 | Han ................ H01L 21/563 |
| 2018/0012865 A1 | 1/2018 | Schrock |
| 2020/0126887 A1 | 4/2020 | Lin et al. |
| 2020/0135606 A1 | 4/2020 | Pan et al. |
| 2021/0066151 A1 | 3/2021 | Hu et al. |

\* cited by examiner

SEMICONDUCTOR PACKAGE AND METHOD OF MANUFACTURING SEMICONDUCTOR PACKAGE

PRIORITY STATEMENT

This application is a continuation of U.S. application Ser. No. 17/357,184, filed on Jun. 24, 2021, which application claims priority under 35 U.S.C. § 119 to Korean Patent Application No. 10-2020-0160076, filed on Nov. 25, 2020 in the Korean Intellectual Property Office (KIPO), the contents of which are herein incorporated by reference in their entirety.

BACKGROUND

Example embodiments relate to a semiconductor package and a method of manufacturing the semiconductor package. More particularly, example embodiments relate to a semiconductor package including a plurality of different chips stacked on a package substrate using an interposer and a method of manufacturing the same.

An electronic device includes a high bandwidth memory or a stacked chip package to provide high performances such as a high capacitance and a high speed. A package used for such an electronic device may be provided with a high density interconnection using an extra substrate, such as a silicon interposer. However, there is a problem in that warpage occurs due to a difference in coefficients of thermal expansion between individual components constituting the electronic device, and peeling occurs due to an increase in stress between interfaces of different materials.

SUMMARY

Example embodiments provide a semiconductor package including a molded interposer capable of improving reliability.

Example embodiments provide a method of manufacturing the semiconductor package.

According to example embodiments, a semiconductor package includes a package substrate, an interposer on the package substrate, a plurality of semiconductor devices on the interposer and spaced apart from each other, the semiconductor devices being electrically connected to the interposer, a dam structure on the interposer extending along a peripheral region of the interposer, the dam structure being spaced apart from the semiconductor devices, and a stress relief on the interposer, the stress relief including an elastic member that fills gaps between the semiconductor devices and the dam structure.

According to example embodiments, a semiconductor package includes a package substrate, an interposer on the package substrate, the interposer having a plurality of first and second bonding pads disposed respectively on a first surface and an opposite second surface of the interposer and electrically connected to each other, a plurality of semiconductor devices on the first surface of the interposer and spaced apart from each other, the semiconductor devices being electrically connected to the first bonding pads, a dam structure on the first surface of the interposer extending along a peripheral region of the interposer, the dam structure being spaced apart from the semiconductor devices, a stress relief on the first surface of the interposer including an elastic member that fills gaps between the semiconductor devices and the dam structure, and a first underfill member between the semiconductor devices and the first surface of the interposer.

According to example embodiments, a semiconductor package includes a package substrate, an interposer on the package substrate, a plurality of semiconductor devices on the interposer and spaced apart from each other, a first underfill member between each of the semiconductor devices and the interposer, a dam structure on the interposer and extending along a peripheral region of the interposer, the dam structure being spaced apart from the semiconductor devices, a stress relief on the interposer including an elastic member that fills gaps between the semiconductor devices and the dam structure, a second underfill member between the interposer and the package substrate, and a heat slug on the package substrate, the heat slug covering and thermally contacting the semiconductor devices. A width of the dam structure is within a range of 200 µm to 400 µm.

According to example embodiments, a semiconductor package may include a package substrate, an interposer provided on the package substrate, first and second semiconductor devices arranged on the interposer to be spaced apart from each other, a dam structure on the interposer extending along a peripheral region of the interposer and being spaced apart from the first and second semiconductor devices, and a stress relief having an elastic member that fills gaps between the first and second semiconductor devices and the dam structure.

Accordingly, the elastic member as the stress relief may reduce stresses between interfaces of different materials to thereby prevent occurrences of peeling or cracks. Further, the dam structure may be provided to extend along the peripheral region of the interposer to increase the overall rigidity of the interposer to thereby reduce or prevent warpage. Thus, it may be possible to improve the reliability of the 2.5 D package.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments.

FIG. 2 is a plan view illustrating the semiconductor package in FIG. 1.

FIG. 3 is an enlarged cross-sectional view illustrating portion 'A' in FIG. 1.

FIGS. 4 to 16 are views illustrating a method of manufacturing a semiconductor package in accordance with example embodiments.

FIG. 17 is a cross-sectional view illustrating a semiconductor package in accordance with example embodiments.

FIG. 18 is an enlarged cross-sectional view illustrating portion 'E' in FIG. 17.

FIGS. 19 to 22 are cross-sectional views illustrating a method of manufacturing a semiconductor package in accordance with example embodiments.

DETAILED DESCRIPTION

Hereinafter, example embodiments will be explained in detail with reference to the accompanying drawings.

Figure 1:
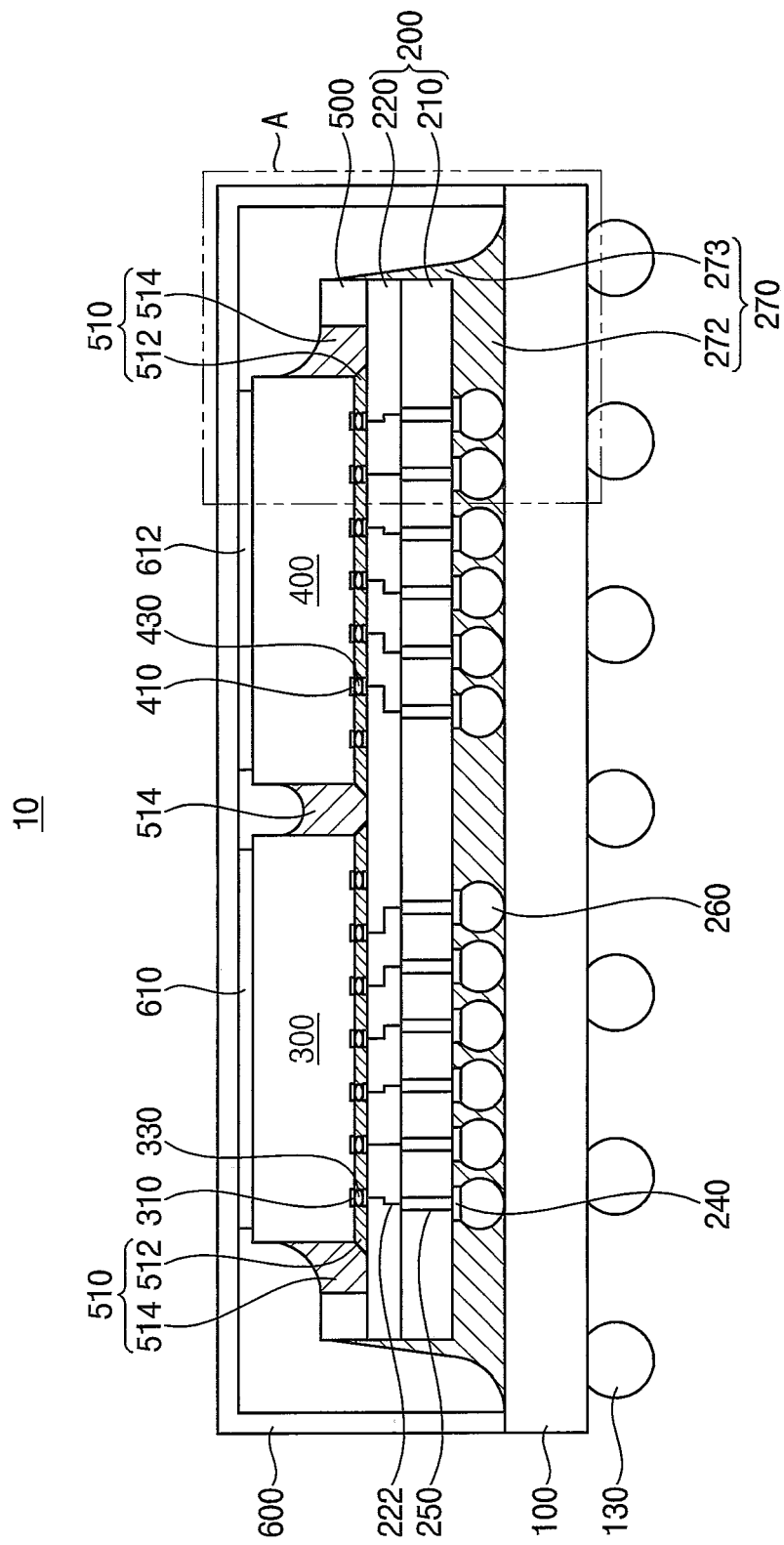
FIGS. 1 to 22 represent non-limiting, example embodiments as described herein.
Figure 2:
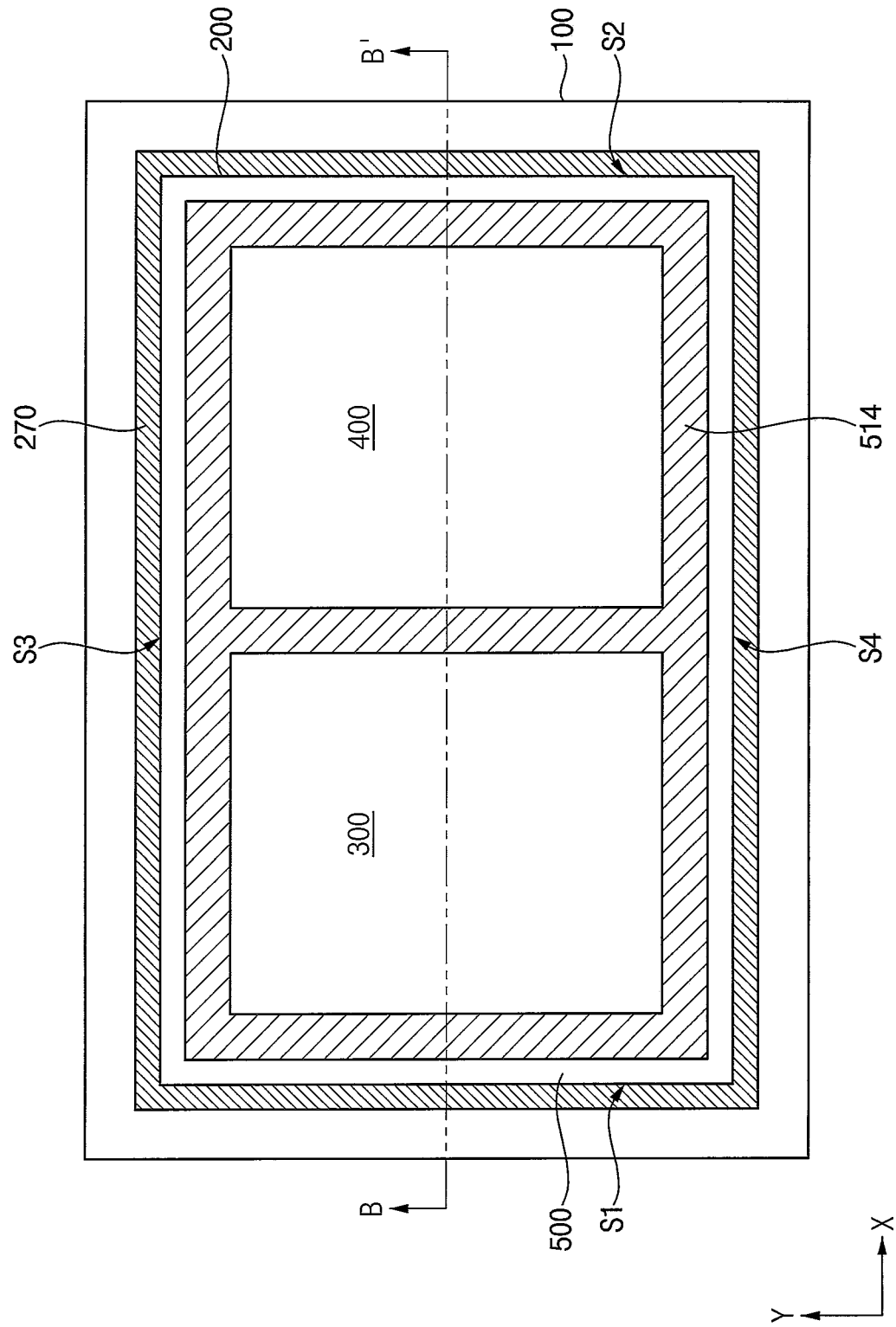
Figure 3:
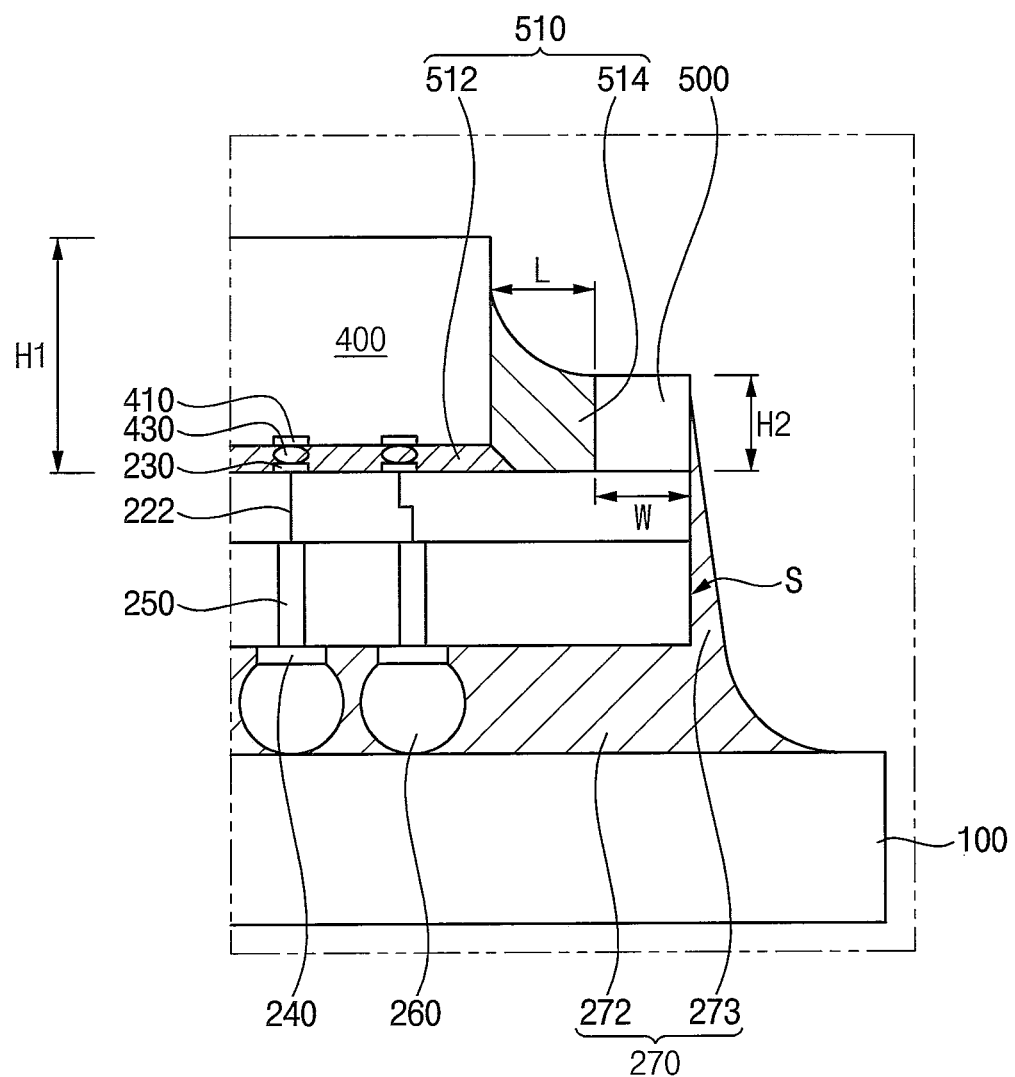

FIG. 1 is a cross-sectional view illustrating a semiconductor package in accordance with example embodiments. FIG. 2 is a plan view illustrating the semiconductor package in FIG. 1. FIG. 3 is an enlarged cross-sectional view illustrating portion 'A' in FIG. 1. FIG. 1 is a cross-sectional view taken along the line B-B' in FIG. 2.

Referring to FIGS. 1 to 3, a semiconductor package 10 may include a package substrate 100, an interposer 200, first and second semiconductor devices 300, 400, a dam structure 500 and a stress relief 510. Additionally, the semiconductor package 10 may further include first and second underfill members 512, 270 and a heat slug 600.

In example embodiments, the semiconductor package 10 may be a memory device having a stacked chip structure in which a plurality of dies (chips) is stacked. For example, the semiconductor package 10 may include a semiconductor memory device with a 2.5 D chip structure. In this case, the first semiconductor device 300 may include a logic semiconductor device, and the second semiconductor device 400 may include a memory device. The logic semiconductor device may include a CPU, a GPU, an ASIC, or an SOC. The memory device may include a high bandwidth memory (HBM) device.

In example embodiments, the package substrate 100 may be a substrate having an upper surface and a lower surface opposite to each other. For example, the package substrate 100 may be a printed circuit board (PCB). The PCB may be a multilayered circuit board including vias and various circuits therein.

The interposer 200 may be disposed on the package substrate 100. The interposer 200 may be mounted on the package substrate 100 through solder bumps 260. A planar area (e.g., of a lower surface) of the interposer 200 may be less than a planar area (e.g., of the upper surface) of the package substrate 100. The interposer 200 may be disposed within the area of the package substrate 100 in plan view.

The interposer 200 may be a silicon interposer or a redistribution interposer including a plurality of wirings therein. The first semiconductor device 300 and the second semiconductor devices 400 may be connected to each other through the wirings and may be electrically connected to the package substrate 100 through the solder bumps 260. The silicon interposer may provide a high density interconnection between the first and second semiconductor devices 300 and 400.

In the case of the silicon interposer, the interposer 200 may include a semiconductor substrate 210, a wiring layer 220 including a plurality of wirings 222 on an upper surface of the semiconductor substrate 210, a plurality of first bonding pads 230 provided on the wiring layer 220 and a plurality of second bonding pads 240 provided on a lower surface of the semiconductor substrate 210.

For example, the interposer 200 may have an area of 20 mm×30 mm or more. The substrate 210 may include may include silicon, germanium, silicon-germanium, or III-V compounds, e.g., GaP, GaAs, GaSb, etc.

The wiring layer 220 may include a plurality of insulation layers and a plurality of wirings 222 in the insulation layers. For example, the wirings may include a metal such as copper Cu.

The semiconductor substrate 210 may include a plurality of through electrodes 250 penetrating therethrough. The through electrode 250 may include a through silicon via. The through electrode 250 may be provided to extend in a thickness direction or vertical direction from a first surface of the semiconductor substrate 210. An end portion of the through electrode 250 may contact the wiring 222 of the wiring layer 220.

The interposer 200 may be mounted on the package substrate 100 via the solder bumps 260. The solder bump 260 may be formed on the second bonding pad 240. For example, the solder bump 260 may include C4 bump. The second bonding pad 240 of the interposer 200 may be electrically connected to a substrate pad of the package substrate 100 by the solder bump 260.

In example embodiments, the first semiconductor device 300 may be arranged on the interposer 200. The first semiconductor device 300 may be mounted on the interposer 200 in a flip chip bonding manner. In this case, the first semiconductor device 300 may be mounted such that an active surface of the first semiconductor device 300 on which chip pads 310 are formed face the interposer 200. The chip pads 310 of the first semiconductor device 300 may be electrically connected to the first bonding pads 230 of the interposer 200 by conductive bumps 330. For example, the conductive bumps may include micro bump (uBump).

The second semiconductor device 400 may be arranged on the interposer 200 to be spaced apart from the first semiconductor device 300. The second semiconductor device 400 may be mounted on the interposer 200 in a flip chip bonding manner. In this case, the second semiconductor device 400 may be mounted such that an active surface of the second semiconductor device 400 on which chip pads 410 are formed face the interposer 200. The chip pads 410 of the second semiconductor device 400 may be electrically connected to the first bonding pads 230 of the interposer 200 by conductive bumps 430. For example, the conductive bumps 430 may include micro bump (uBump).

Although only one first semiconductor device 300 and one second semiconductor device 400 are illustrated in the figures, the numbers and arrangements thereof are by way of example, and it may not be limited thereto. For example, the second semiconductor device 400 may include a buffer die and a plurality of memory dies (chips) sequentially stacked on the buffer die. The buffer die and the memory dies may be electrically connected to each other by through silicon vias (TSVs).

The wirings 222 may be electrically connected to the through electrodes 250. The first and second semiconductor devices 300, 400 may be electrically connected to the package substrate 100 through the wirings 222 and the through electrodes 250. The first semiconductor device 300 and the second semiconductor devices 400 may be electrically connected to each other by the wirings 222.

In example embodiments, the first underfill members 512 may be underfilled between the first semiconductor device 300 and the interposer 200 and between the second semiconductor device 400 and the interposer 200. The second underfill member 270 may be underfilled between the interposer 200 and the package substrate 100.

The first underfill members 512 may extend between the first and second semiconductor devices 300, 400 and the interposer 200 to reinforce a gap between the first and second semiconductor devices 300, 400 and the interposer 200.

The second underfill member 270 may include a second horizontal extension 272 and a second vertical extension 273. The second horizontal extension 272 may extend between the interposer 200 and the package substrate 100 to reinforce a gap between the interposer 200 and the package substrate 100. The second vertical extension 273 may extend upwardly from the upper surface of the package substrate 100 to cover portions of sidewalls of the interposer 200 to firmly support the interposer 200.

The first and second underfill members 512, 270 may include a material having a relatively high fluidity to effectively fill small spaces between the first and second semiconductor devices 300, 400 and the interposer 200 and between the interposer 200 and the package substrate 100. For example, the first and second underfill members 512, 270 may include an adhesive including an epoxy material.

As illustrated in FIG. 2, the interposer 200 may include a first side surface S1 and a second side surface S2 extending in a direction parallel with a first direction (Y direction) which is perpendicular to the upper surface thereof and opposite to each other, and a third side surface S3 and a fourth side surface S4 extending in a direction parallel with a second direction (X direction) which is perpendicular to the first direction and opposite to each other. The interposer 200 may have a rectangular plate shape.

The first and second semiconductor devices 300, 400 may be arranged on an upper surface of the interposer 200 to be spaced apart from each other. A first side portion of the first semiconductor device 300 may be arranged adjacent to the first side surface S1, and a second side portion of the second semiconductor devices 400 may be arranged adjacent to the second side surface S2.

The first and second semiconductor devices 300, 400 may be spaced apart from the side surface of the interposer 200 by a predetermined distance, for example, within a range of 900 μm to 1,400 μm.

In example embodiments, the dam structure 500 may be arranged on the upper surface of the interposer 200 to extend along a peripheral region of the interposer 200. The dam structure 500 may extend to surround the semiconductor devices 300, 400.

The dam structure 500 may be arranged to be spaced apart from the first, second semiconductor devices 300, 400 by a predetermined distance L. For example, the spacing distance L may be within a range of 500 μm to 1,000 μm. The dam structure 500 may be attached on the upper surface of the interposer 200 by an adhesive film such as die attach film (DAF). For example, the dam structure 500 may include a silicon material.

The second semiconductor device 400 may have a first height H1 the same as or greater than a height of the first semiconductor device 300. The dam structure 500 may have a second height H2. The second height H2 of the dam structure 500 may be smaller than the first height H1 of the second semiconductor device 400. The first height H1 of the second semiconductor device 400 may be 700 μm or more. The second height H2 of the dam structure 500 may be 30% to 80% of the first height H1. The second height H2 of the dam structure 500 may be within a range of 250 μm to 650 μm.

In example embodiments, an elastic member 514 may be provided on the interposer 200 to fill gaps between the first and second semiconductor devices 300, 400 and the dam structure 500. The elastic member 514 may cover side surfaces of the first and second semiconductor devices 300, 400 and an inner surface of the dam structure 500. The elastic member 514 may cover lower outer surfaces of the first and second semiconductor devices 300, 400 and the entire inner surface of the dam structure 500.

An upper surface of the elastic member 514 may be lower than an upper surface of the second semiconductor device 400. An upper surface of the dam structure 500 may be exposed by the elastic member 514. An outer surface of the dam structure 500 may be coplanar with an outer surface of the interposer 200. The second vertical extension 273 of the second underfill member 270 may cover at least a portion of the outer surface of the dam structure 500. For example, the second vertical extension 273 of the second underfill member 270 may cover a height of 20% to 80% of the total height of the outer surface of the dam structure 500.

The elastic member 514 may include a material having a relatively low elastic modulus. For example, the elastic member 514 may have an elastic modulus within a range of 2.0 GPa to 8.5 GPa. As an example, the elastic member may include an epoxy material. The dam structure 500 may have a first stiffness, and the first underfill member 512 may have a second stiffness less than the first stiffness. The elastic member 514 may have a third stiffness the same as or less than the second stiffness.

In example embodiments, the heat slug 600 may be provided on the interposer 200 to cover and thermally contact the semiconductor devices 300, 400. Thermal interface materials (TIM) 610, 612 may be provided on upper surfaces of the first and second semiconductor devices 300, 400 respectively. The heat slug 600 may be disposed on the first and second semiconductor devices 300, 400 to thermally contact the first and second semiconductor devices 300, 400 via the thermal interface materials 610, 612.

Outer connection pads may be formed on the lower surface of the package substrate 100, and outer connection members 130 for an electrical connection with an external device may be disposed on the outer connection pads. The outer connection members 130 may be, for example, solder balls. The semiconductor package 10 may be mounted on a module substrate by the solder balls, thus constituting a memory module.

Although only some first bonding pads and second bonding pads are illustrated in the figures, it may be understood that the first bonding pads and the second bonding pads are by way of example, and thus, it may not be limited thereto.

As mentioned above, the semiconductor package 10 may include the package substrate 100, the interposer 200 provided on the package substrate 100, the first and second semiconductor devices 300, 400 arranged on the interposer 200 to be spaced apart from each other, the dam structure 500 on the interposer 200 extending along the peripheral region of the interposer 200 and being spaced apart from the first and second semiconductor devices 300, 400, and the stress relief 510 having the elastic member 514 that fills the gaps between the first and second semiconductor devices 300, 400 and the dam structure 500.

Accordingly, the elastic member 514 serving as the stress relief may reduce stresses between interfaces of different materials to thereby prevent occurrences of peeling or cracks. Further, the dam structure 500 may be provided to extend along the peripheral region of the interposer 200 to increase the overall rigidity of the interposer 200 to thereby reduce or prevent warpage. Thus, it may be possible to improve the reliability of the 2.5 D package.

Hereinafter, a method of manufacturing the semiconductor package in FIG. 1 will be explained.

FIGS. 4 to 16 are views illustrating a method of manufacturing a semiconductor package in accordance with example embodiments. FIGS. 5 to 11 and 13 to 16 are cross-sectional views taken along the line C-C' in FIG. 4. FIG. 12 is an enlarged plan view illustrating portion 'D' in FIG. 4.

Figure 4:
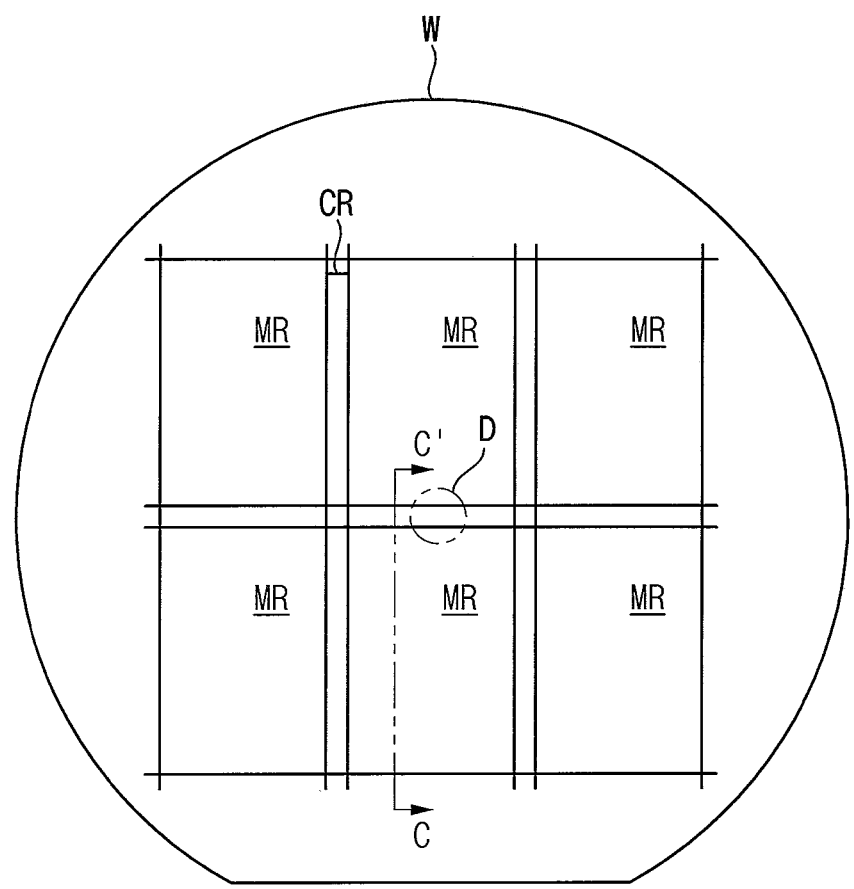
Figure 5:
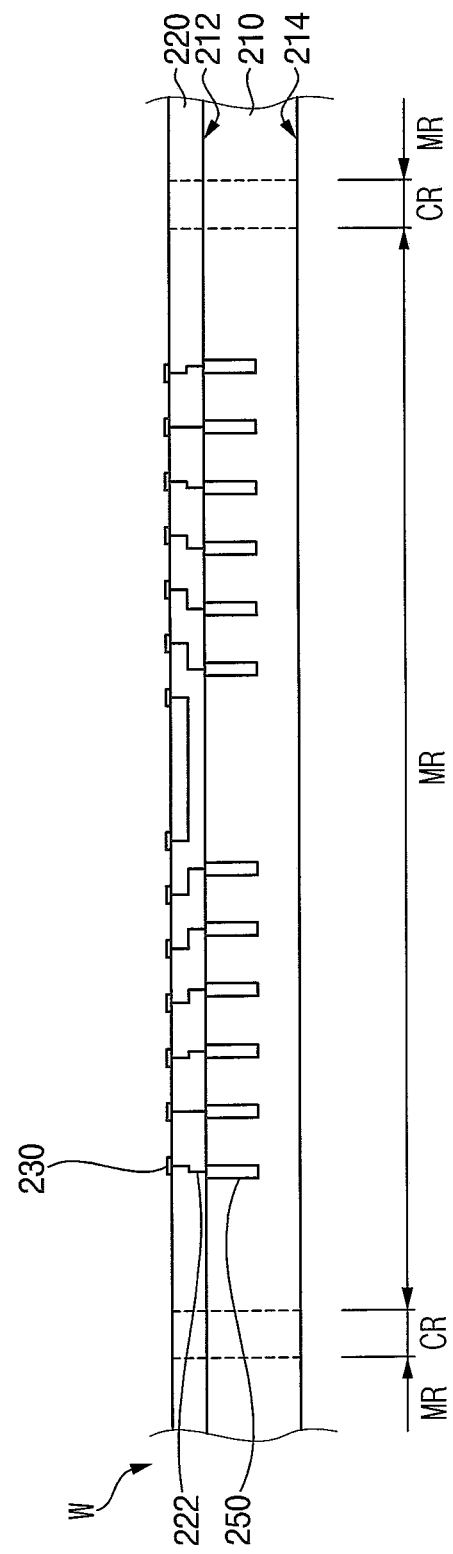

Referring to FIGS. 4 and 5, first, a semiconductor wafer W for a base structure may be prepared.

In example embodiments, the base structure may include a silicon interposer. Alternatively, the base structure may include a redistribution interposer or a semiconductor die in which a logic chip or a memory chip is implemented.

In case of the silicon interposer, the wafer W may include a substrate 210 and a wiring layer 220. The wiring layer 220 may be provided on a first surface 212 of the substrate 210. The wafer W may include a package region, i.e., a mounting region MR where semiconductor device(s) are mounted and a scribe lane region, i.e., a cutting region CR surrounding the mounting region MR. As described later, the wafer W may be cut along the cutting region CR dividing the mounting regions MR to form an individual interposer. For example, the mounting region MR may have an area of 20 mm×30 mm or more.

For example, the substrate 210 may include may include silicon, germanium, silicon-germanium, or III-V compounds, e.g., GaP, GaAs, GaSb, etc. In some embodiments, the substrate 210 may be a silicon-on-insulator (SOI) substrate, or a germanium-on-insulator (GOI) substrate.

The wiring layer 220 may be formed on the first surface 212 of the substrate 210. The wiring layer 220 may be formed by a back process referred to as BEOL (Back End of Line) process. The wiring layer 220 may include a plurality of insulation layers and a plurality of wirings 222 in the insulation layers. For example, the wiring may include a metal such as copper (Cu).

The substrate 210 may include a plurality of through electrodes (through silicon vias) 250 which are formed to penetrate through the substrate. The through electrodes 250 may be electrically connected to the wirings 222 respectively. The through electrode may be formed before grinding a backside of the substrate 210, that is, a second surface 214 (via first, via middle process). Alternatively, the through electrode may be formed after grinding the backside of the substrate 210 (via last process)

A first bonding pad 230 may be provided in or on the outermost insulation layer of the wiring layer 220. The through electrode 250 may be electrically connected to the first bonding pad 230 through the wiring 220.

Figure 6:
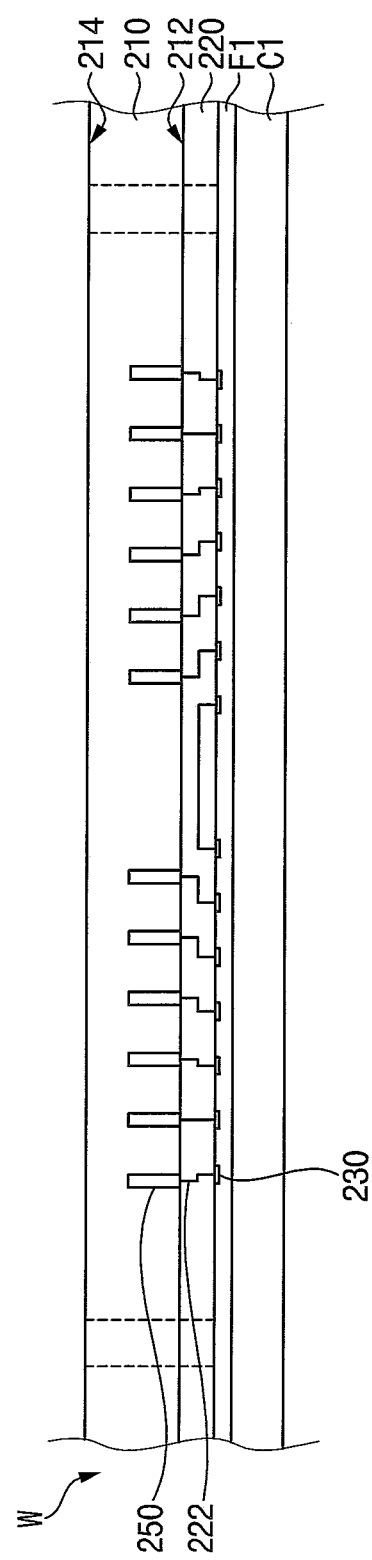
Figure 7:
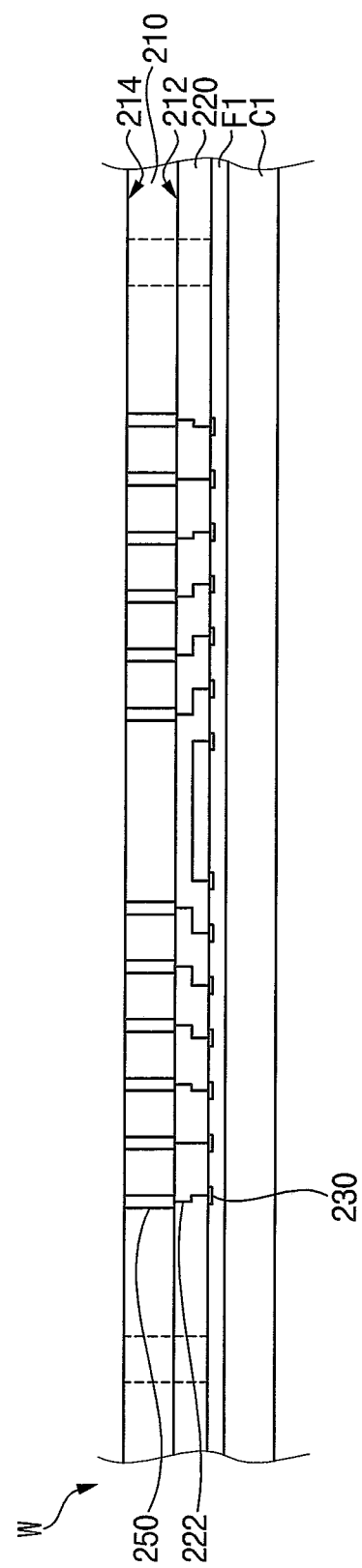
Figure 8:
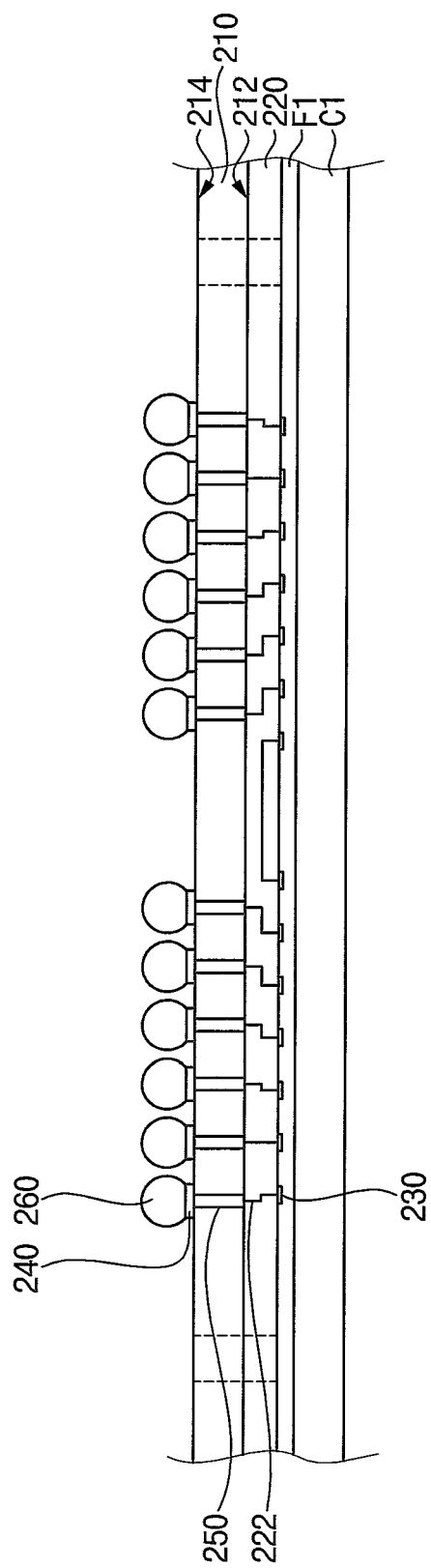

Referring to FIGS. 6 to 8, a second bonding pad 240 may be formed on the second surface 214 of the substrate 210, and a solder bump 260 as a conductive connection member may be formed on the second bonding pad 240.

As illustrated in FIGS. 6 and 7, the backside of the substrate 210, that is, the second surface 214 may be grinded using a substrate or wafer support system (WSS). The wafer W may be adhered on a carrier substrate C1 using a first adhesive film F1, and then, the second surface 214 of the substrate 210 may be grinded until a portion of the through electrode 250 is exposed.

The second surface 214 of the substrate 210 may be partially removed by a grinding process such as a chemical mechanical polishing (CMP) process. Thus, a thickness of the substrate 210 may be reduced to a desired thickness. For example, the substrate 210 may have a thickness range of about 50 µm to 100 µm. Additionally, the portion of the through electrode 250 may be exposed from the second surface 214 of the substrate 210.

As illustrated in FIG. 8, the second bonding pad 240 may be formed on the second surface 214 of the substrate 210 to be electrically connected to the through electrode 250, and the solder bump 260 may be formed on the second bonding pad 240.

The second bonding pad 240 may be formed by forming a seed layer and a photoresist layer on the second surface 214 of the substrate 210, performing an exposure process on the photoresist layer to form a photoresist pattern having an opening that exposes a portion of the seed layer, and performing a plating process on the seed layer.

For example, the second bonding pad 240 may have a diameter of 70 µm to 80 µm. The diameter of the second bonding pad 240 may be at least three times a diameter of the first bonding pad 230.

Then, the solder bump 260 may be formed on the second bonding pad 240.

In particular, a seed layer may be formed on the second bonding pad 240 on the second surface 214 of the substrate 210, and a photoresist pattern having an opening that expose a portion of the seed layer may be formed on the second surface 214 of the substrate 210.

Then, the opening of the photoresist pattern may be filled with a conductive material, and then, the photoresist pattern may be removed and a reflow process may be performed to form the solder bump 260. For example, the conductive material may be formed by a plating process. Alternatively, the solder bump may be formed by a screen printing process, a deposition process, etc.

Then, the carrier substrate C1 may be removed from the wafer W.

Figure 9:
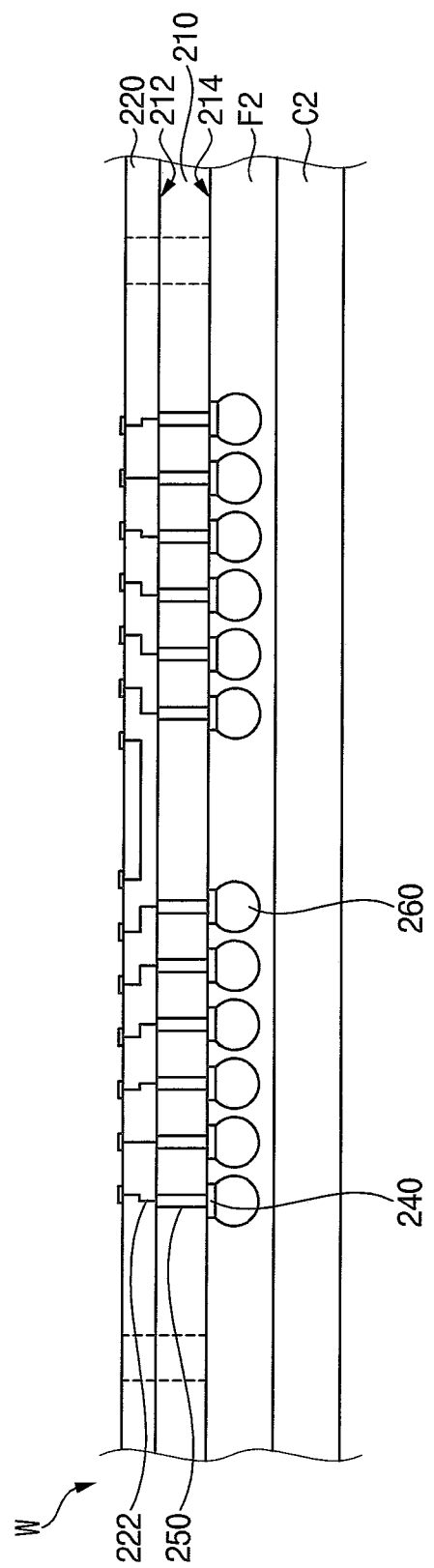
Figure 10:
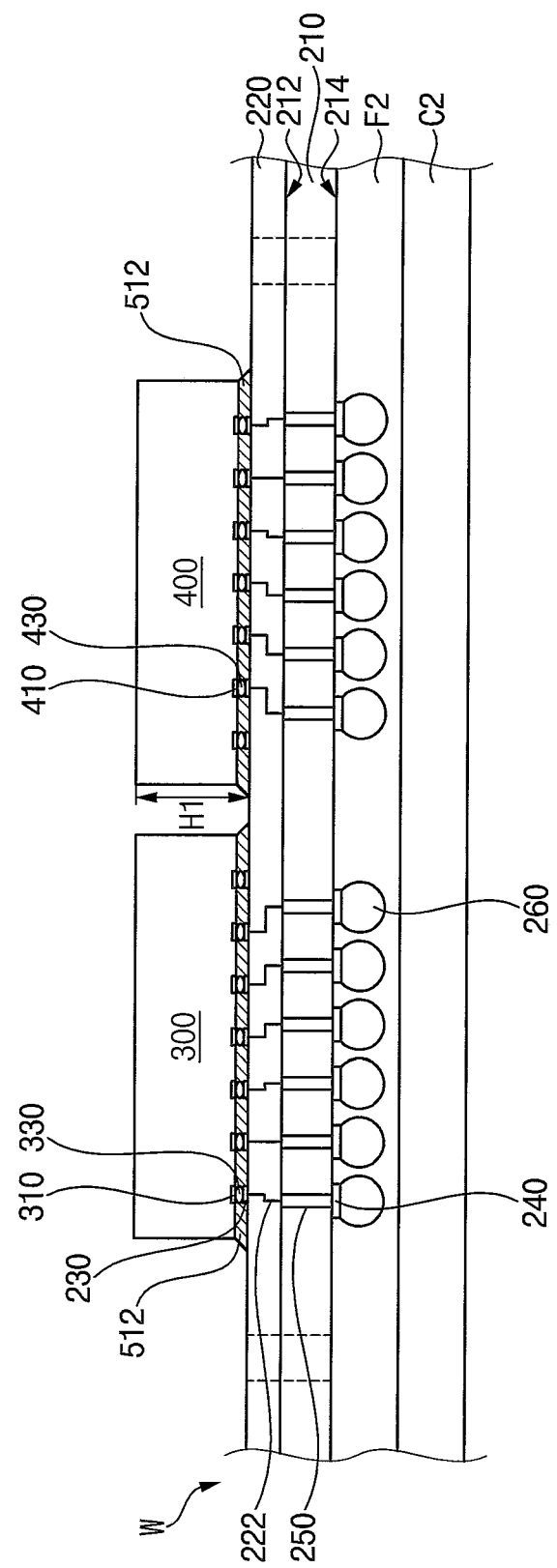

Referring to FIGS. 9 and 10, the structure in FIG. 8 may be reversed, and a plurality of semiconductor devices 300, 400 may be mounted on the wiring layer 220. Then, first underfill members 512 may be formed between the semiconductor devices 300, 400 and the wiring layer 220.

As illustrated in FIG. 9, the wafer W may be adhered on a second carrier substrate C2 using a second adhesive film F2. The wafer W may be adhered on the second carrier substrate C2 such that the first bonding pads 230 are exposed.

As illustrated in FIG. 10, the first semiconductor device 300 and the second semiconductor device 400 may be arranged on the wiring layer 220 to be spaced apart from each other.

In example embodiments, the first and second semiconductor devices may be mounted on the wiring layer 220 in a flip chip bonding manner. Chip pads 310 of the first semiconductor device 300 may be electrically connected to the first bonding pads 230 of the wiring layer 220 by conductive bumps 330. Chip pads 410 of the second semiconductor device 400 may be electrically connected to the first bonding pads 230 of the wiring layer 220 by conductive bumps 430. For example, the conductive bumps 330, 430 may include micro bump (uBump).

For example, the first semiconductor device 300 may include a logic semiconductor device, and the second semiconductor device 400 may include a memory device. The logic semiconductor device may include a CPU, a GPU, an ASIC, or an SOC. The memory device may include a high bandwidth memory (HBM) device. In this case, the second semiconductor device may include a buffer die and a plurality of memory dies (chips) sequentially stacked on the buffer die. The buffer die and the memory dies may be electrically connected to each other by through silicon vias.

Then, an underfill solution may be dispensed between the first semiconductor device 300 and the wiring layer 220 and between the second semiconductor device 400 and the wiring layer 220 while moving a dispenser nozzle along edges of the first and second semiconductor devices 300, 400, and the underfill solution may be cured to form the first underfill members 512. The first underfill members 512 may extend between the first and second semiconductor devices 300, 400 and the wiring layer 220 to reinforce a gap between the first and second semiconductor devices 300, 400 and the wiring layer 220.

The first underfill member 512 may include a material having a relatively high fluidity so as to effectively fill a small space between the first and second semiconductor devices 300, 400 and the wiring layer 220. For example, the first and second underfill members may include an adhesive including an epoxy material. The first underfill member 512 may have a coefficient of thermal expansion within a range of 30 ppm/° C. to 105 ppm/° C.

The second semiconductor device 400 may have a first height H1 (see FIG. 3) the same as or greater than a height of the first semiconductor device 300. The first height H1 of the second semiconductor device 400 may be 700 μm or more.

Figure 11:
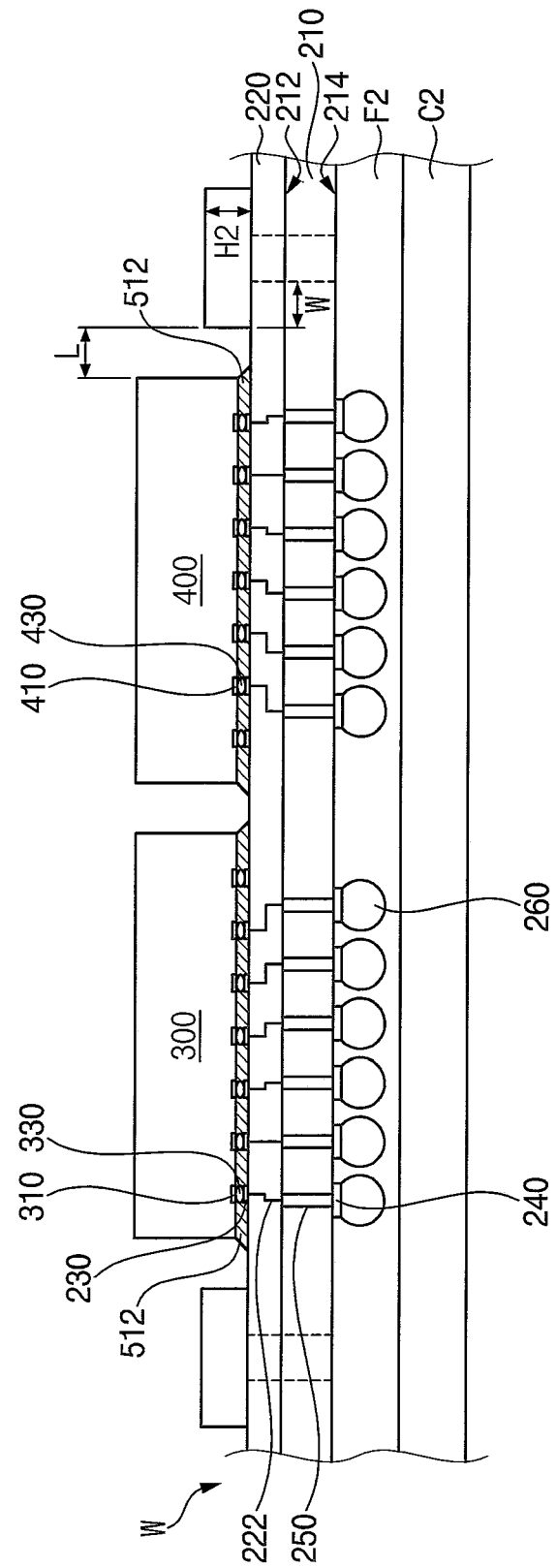
Figure 12:
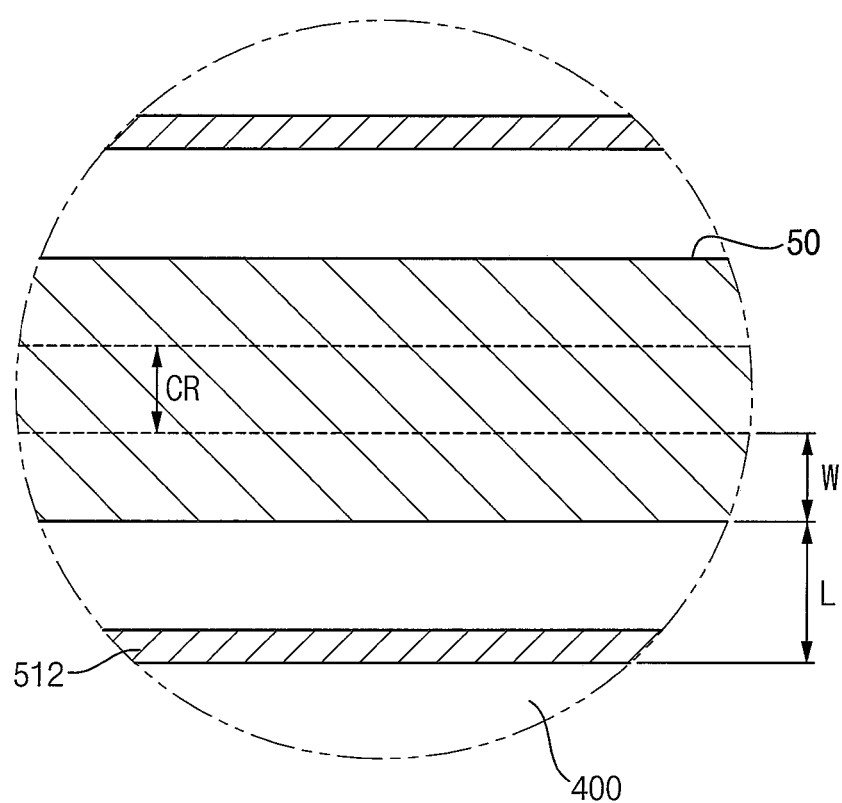

Referring to FIGS. 11 and 12, a dummy die 50 may be disposed along the cutting region CR of the wafer W1 to cover a peripheral region of the mounting region MR.

In example embodiments, the dummy die 50 may be disposed on the wiring layer 220 to cover the peripheral region of the mounting region MR. The dummy die 50 may be attached on the wiring layer 220 by an adhesive film such as die attach film (DAF). For example, the dummy die 50 may include a silicon substrate.

The dummy die 50 may be arranged to be spaced apart from the first and second semiconductor devices 300, 400 by a predetermined distance L. The spacing distance L may be within a range of 500 μm to 1,000 μm. The dummy die 50 may have a second height H2 smaller than the first height H1 of the second semiconductor device 400. The second height H2 of the dummy die 50 may be within a range of 250 μm to 650 μm. The dummy die 50 may have a first stiffness, and the first underfill member 512 may have a second stiffness smaller than the first stiffness.

Figure 13:
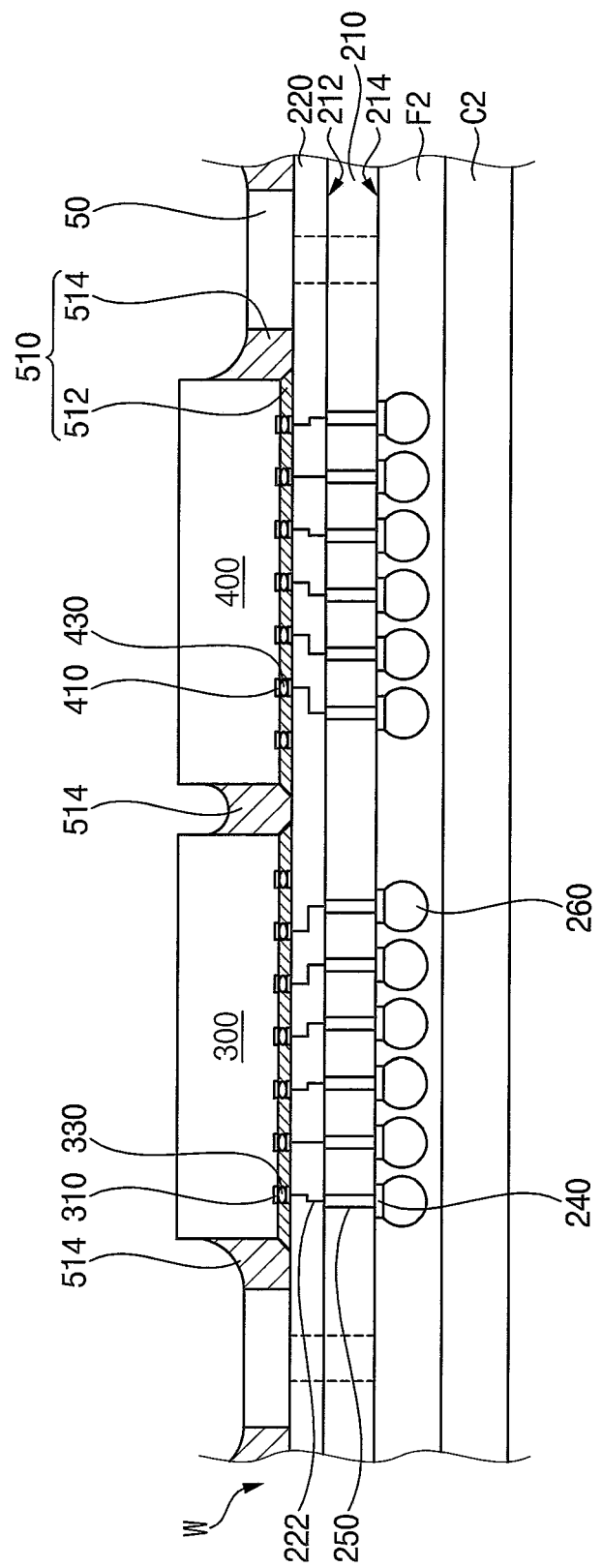
Figure 14:
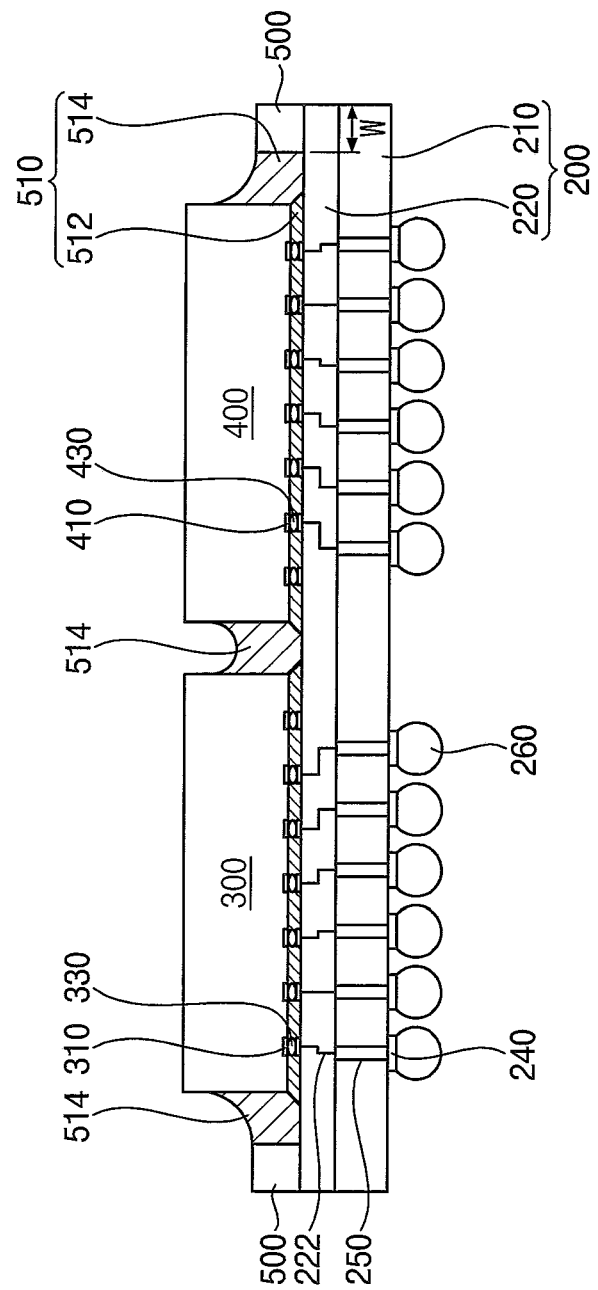

Referring to FIGS. 13 and 14, an elastic member 514 may be formed on the wiring layer 220 to fill gaps between the semiconductor devices 300, 400 and the dummy die 50, and the wafer W may be cut along the cutting region CR to form the individual interposer 200.

In example embodiments, a paste material may be dispensed on the wiring layer 220 while moving a dispenser nozzle between the first and second semiconductor devices 300, 400 and the dummy die 50, and the paste material may be cured to form the elastic member 514.

For example, the paste material may include an epoxy material. The dummy die 50 may prevent the paste material from flowing down so that the paste material covers interfaces between the interposer substrate die or wiring layer, the first underfill member and the semiconductor devices. The elastic member 514 may have an elastic modulus within a range of 2.0 GPa to 8.5 GPa.

Then, when the wafer W is sawed by a sawing process, a portion of the dummy die 50 in the cutting region CR may also be sawed to form a dam structure 500.

Thus, the elastic member 514 may serve as a stress relief 510 together with the first underfill member 512 to reduce stresses between the interfaces of different materials to thereby prevent occurrences of peeling or cracks. Further, the dam structure 500 may be provided to extend along the peripheral region of the interposer 200 to increase the overall rigidity of the interposer 200 to thereby reduce or prevent warpage.

Figure 15:
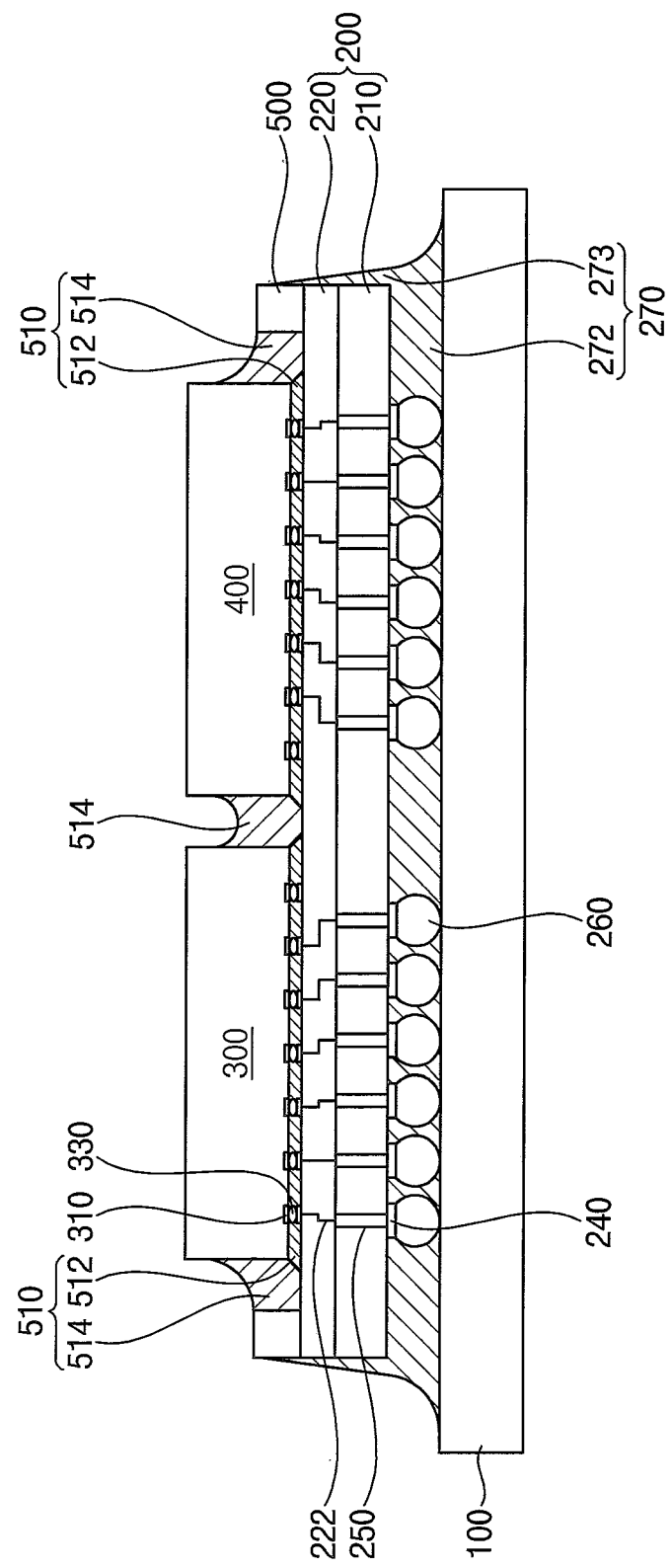

Referring to FIG. 15, the interposer 200 on which the first and second semiconductor devices 300, 400 are mounted may be disposed on a package substrate 100. Then, a second underfill member 270 may be formed between the interposer 200 and the package substrate 100.

In example embodiments, the interposer 200 may be mounted on the package substrate 100 through the solder bumps 260. The interposer 200 may be attached on the package substrate 100 by a thermal compression process.

Then, an underfill solution may be dispensed between the interposer 200 and the package substrate 100 while moving a dispenser nozzle along edges of the interposer 200, and the underfill solution may be cured to form the second underfill member 270.

The second underfill member 270 may include a second horizontal extension 272 extending between the interposer 200 and the package substrate 100 to reinforce a gap between the interposer 200 and the package substrate 100. Additionally, the second underfill member 270 may include second vertical extensions 273 respectively covering portions of sidewalls of the interposer 200 to firmly support the interposer 200. In example embodiments, the second underfill member 270 may cover at least a portion of an outer surface of the dam structure 500.

Figure 16:
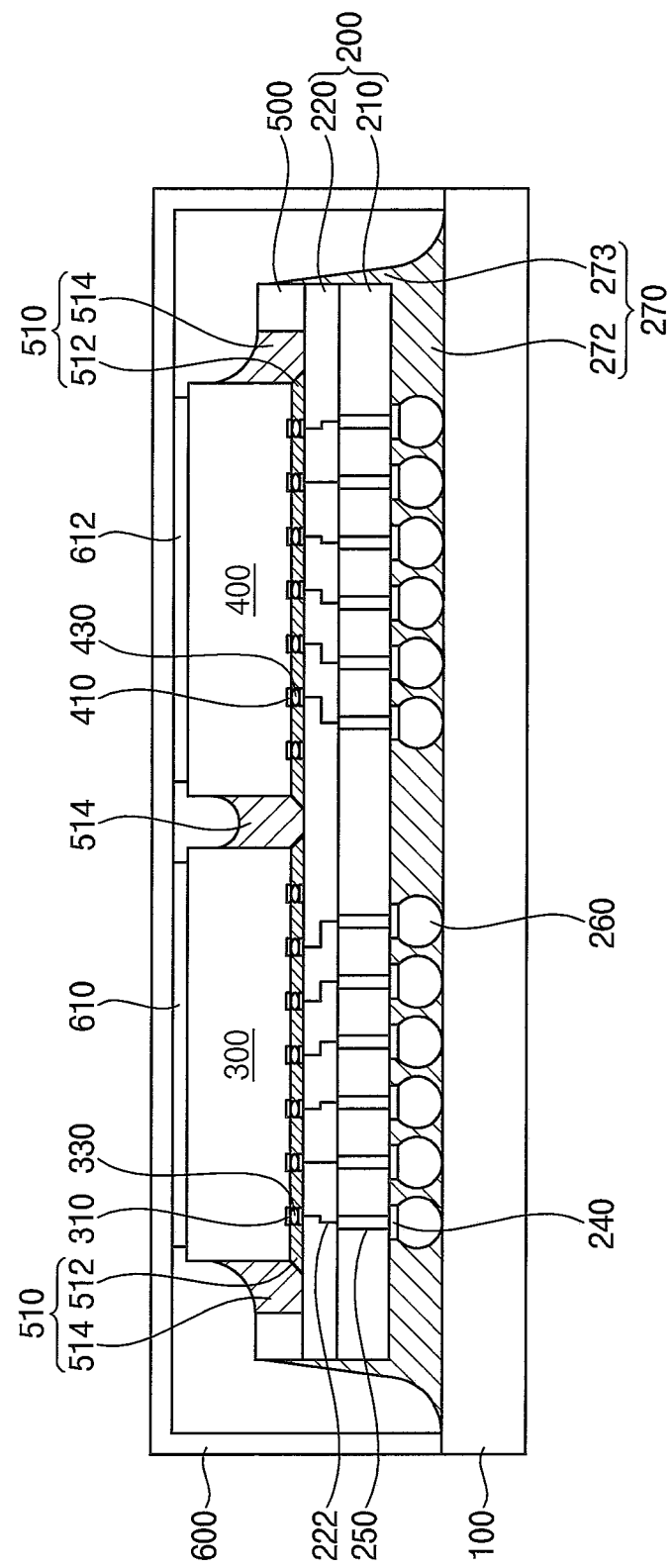

Referring to FIG. 16, a heat slug 600 may be formed on the package substrate 100 to cover and thermally contact the semiconductor devices 300, 400, and outer connection members such as solder balls may be formed on outer connection pads on a lower surface of the package substrate 100 to complete the semiconductor package 10 in FIG. 1.

In example embodiments, thermal interface materials (TIM) 610, 612 may be formed on upper surfaces of the first and second semiconductor devices 300, 400 respectively, and the heat slug 600 may be disposed on the first and second semiconductor devices 300, 400 to thermally contact the first and second semiconductor devices 300, 400 via the thermal interface materials 610, 612.

Figure 17:
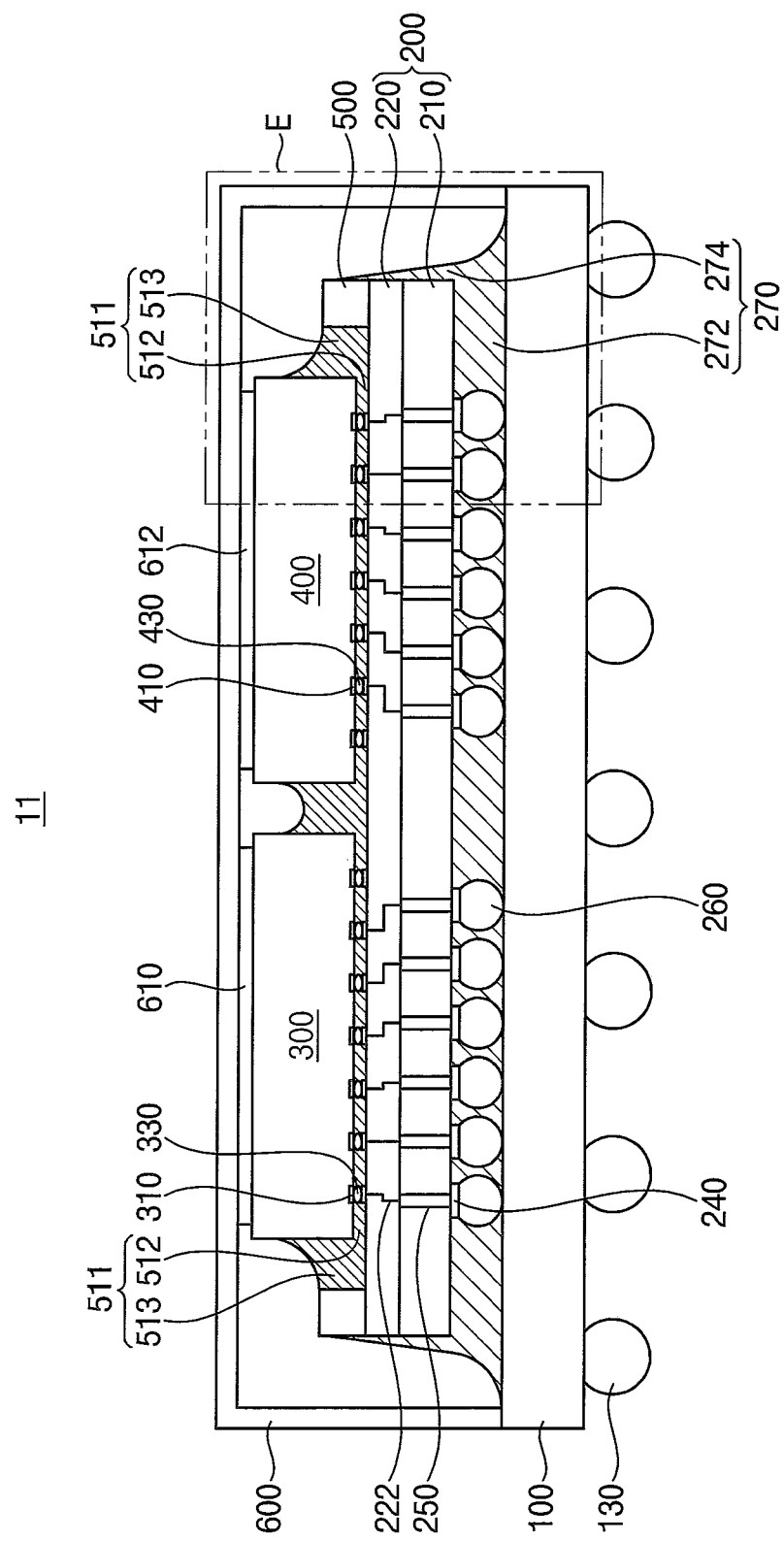
Figure 18:
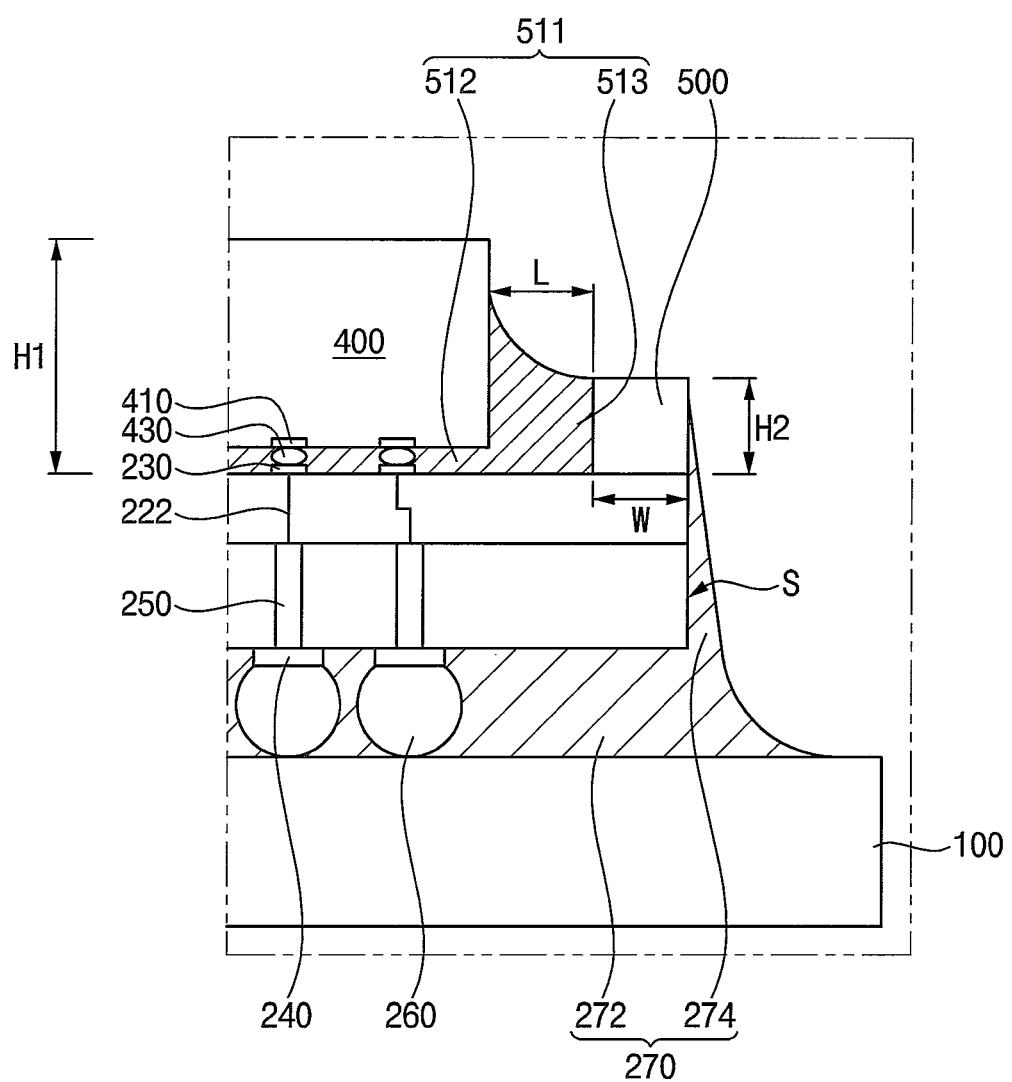

FIG. 17 is a cross-sectional view illustrating a semiconductor package in accordance with example embodiments. FIG. 18 is an enlarged cross-sectional view illustrating portion 'E' in FIG. 17. The semiconductor package may be substantially the same as or similar to the semiconductor package described with reference to FIGS. 1 to 3 except for a configuration of a stress relief. Thus, the same reference numerals will be used to refer to the same or like elements and any further repetitive explanation concerning the above elements may be omitted in the interest of brevity.

Referring to FIGS. 17 and 18, a stress relief 511 of a semiconductor package 11 may include a first horizontal extension 512 as a first underfill member and a first vertical extension as an elastic member. The first vertical extension 513 may be formed integrally with the first horizontal extension 512.

In particular, the first horizontal extension 512 may extend between first and second semiconductor devices 300, 400 and an interposer 200 to reinforce gaps between the first and second semiconductor devices 300, 400 and the interposer 200.

The first vertical extension 513 may be provided on the interposer 200 to fill gaps between the first and second semiconductor devices 300, 400 and a dam structure 500. The first vertical extension 513 may cover side surfaces of the first and second semiconductor devices 300, 400 and an inner surface of the dam structure 500. The first vertical extension 513 may fill a gap between the first semiconductor device 300 and the second semiconductor device 400. The first vertical extension 513 may fill gaps between lower outer surfaces of the first and second semiconductor devices 300, 400 and the entire inner surface of the dam structure 500.

An upper surface of the first vertical extension 513 may be lower than an upper surface of the second semiconductor device 400. An upper surface of the dam structure 500 may be exposed by the first vertical extension 513. An outer surface of the dam structure 500 may be coplanar with an outer surface of the interposer 200.

The first vertical extension 513 may include a material having a relatively low elastic modulus. For example, the first vertical extension 513 may include an epoxy material.

Accordingly, the first vertical extension 513 as the stress relief may reduce stresses between interfaces of different materials to thereby prevent occurrences of peeling or cracks.

Hereinafter, a method of manufacturing the semiconductor package in FIG. 17 will be explained.

FIGS. 19 to 22 are cross-sectional views illustrating a method of manufacturing a semiconductor package in accordance with example embodiments.

Figure 19:
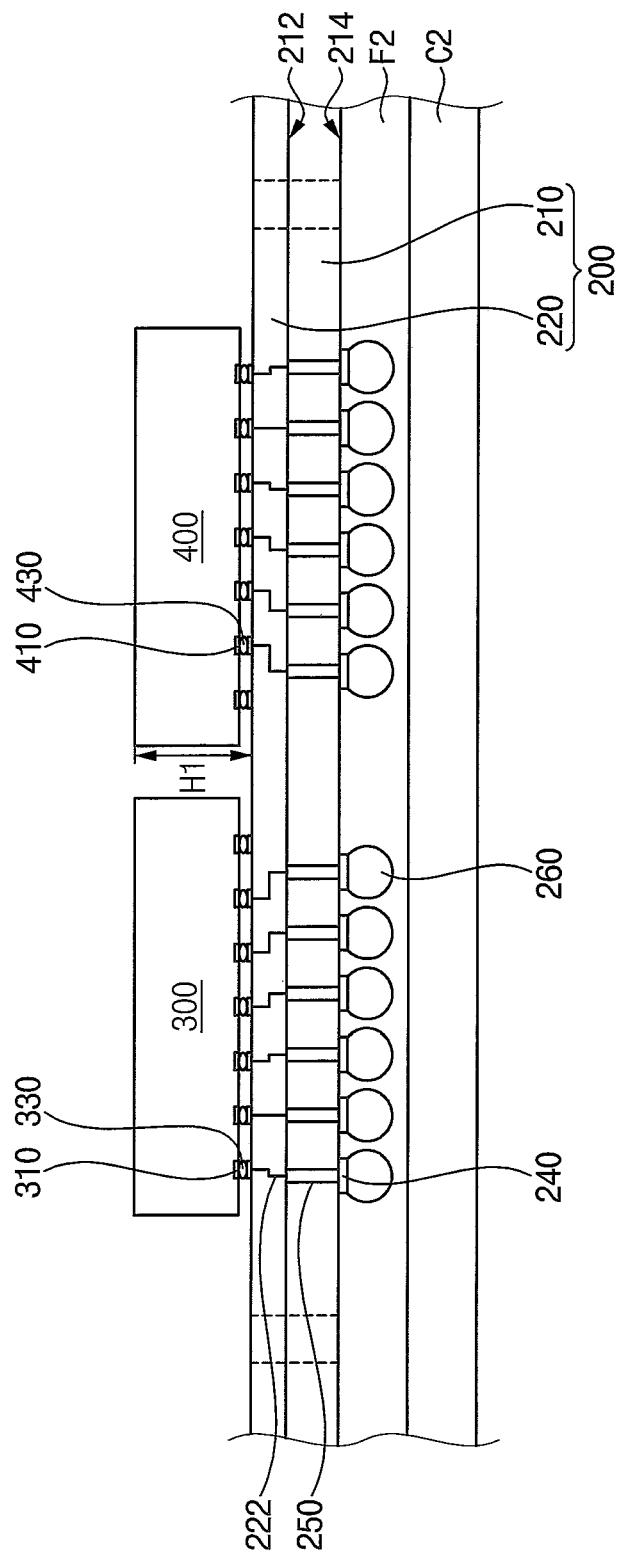

Referring to FIG. 19, first, processes the same as or similar to the processes described with reference to FIGS. 4 to 10 may be performed to mount a plurality of semiconductor devices 300, 400 on a wiring layer 220.

A first semiconductor device 300 and a second semiconductor device 400 may be arranged on the wiring layer 220 to be spaced apart from each other.

In example embodiments, the first and second semiconductor devices may be mounted on the wiring layer 220 in a flip chip bonding manner. Chip pads 310 of the first semiconductor device 300 may be electrically connected to first bonding pads 230 of the wiring layer 220 by conductive bumps 330. Chip pads 410 of the second semiconductor device 400 may be electrically connected to the first bonding pads 230 of the wiring layer 220 by conductive bumps 430. For example, the conductive bumps 330, 430 may include micro bump (uBump).

Figure 20:
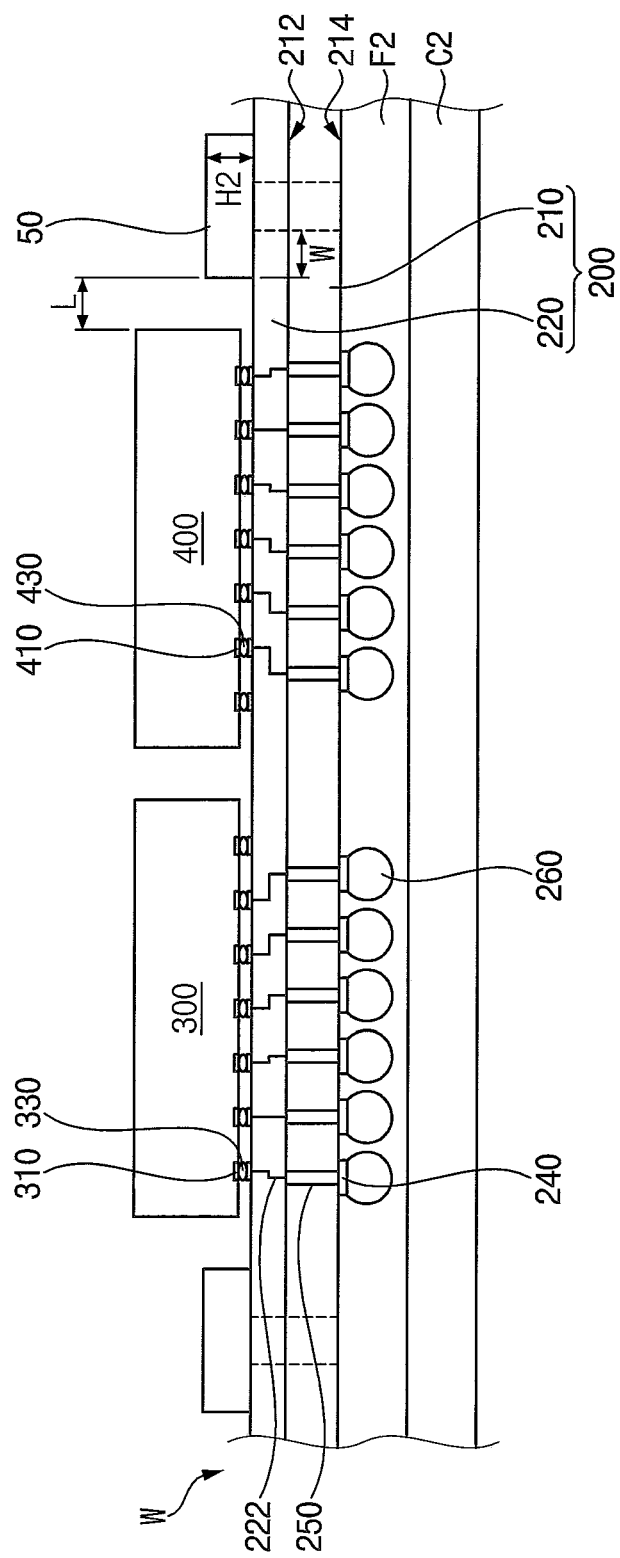

Referring to FIG. 20, a dummy die 50 may be disposed along a cutting region CR of a wafer W1 to cover a peripheral region of a mounting region MR.

In example embodiments, the dummy die 50 may be disposed on the wiring layer 220 to cover the peripheral region of the mounting region MR. The dummy die 50 may be attached on the wiring layer 220 by an adhesive film such as die attach film (DAF). For example, the dummy die 50 may include a silicon substrate.

The dummy die 50 may be arranged to be spaced apart from the first and second semiconductor devices 300, 400 by a predetermined distance L. The spacing distance L may be within a range of 500 μm to 1,000 μm. The dummy die 50 may have a second height H2 smaller than a first height H1 (FIG. 18) of the second semiconductor device 400. The second height H2 of the dummy die 50 may be within a range of 250 μm to 650 μm.

Figure 21:
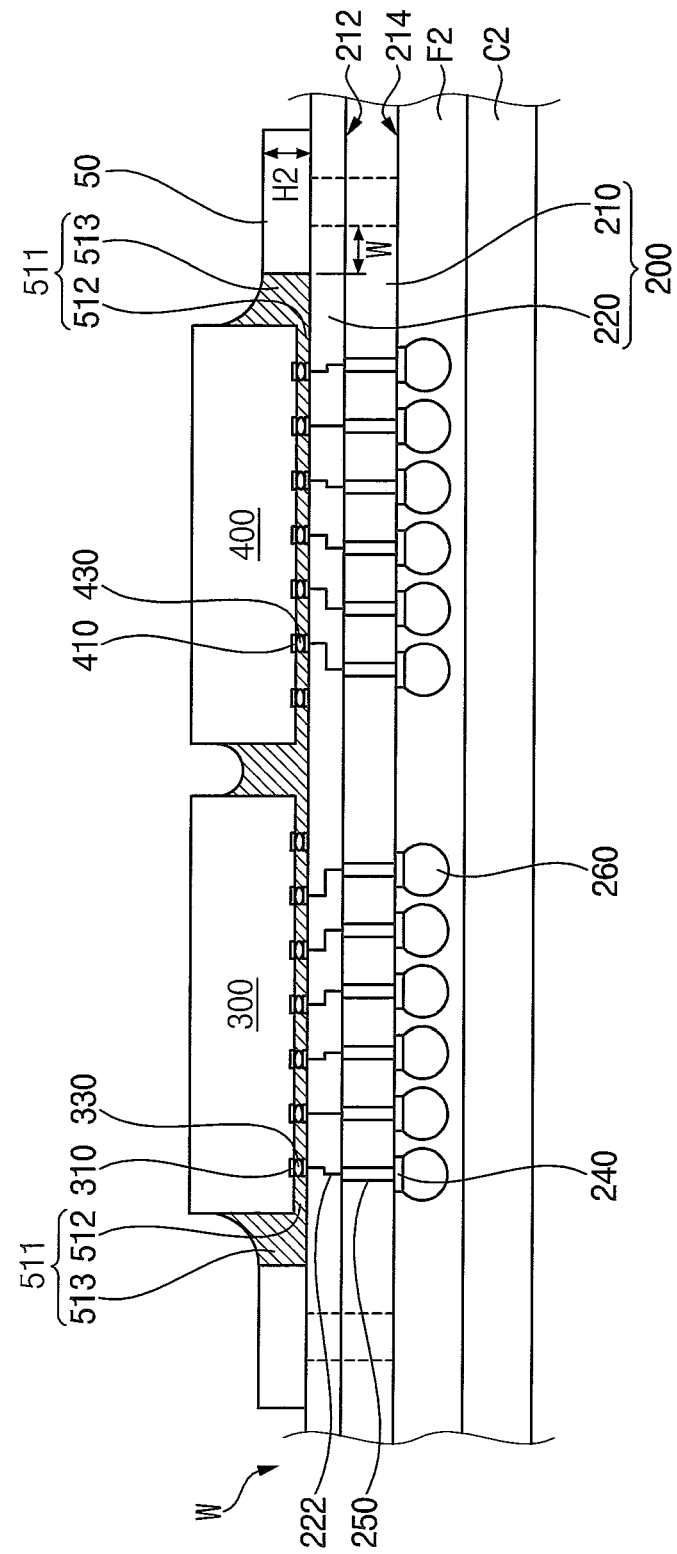

Referring to FIG. 21, a stress relief 511 may be formed on the interposer 200 to fill gaps between the first and second semiconductor devices 300, 400 and the dummy die 50.

In example embodiments, a paste material may be dispensed on the wiring layer 220 while moving a dispenser nozzle between the first and second semiconductor devices 300, 400 and the dummy die 50, and the paste material may be cured to form the stress relief 511.

For example, the paste material may include an epoxy material. The dummy die 50 may prevent the paste material from flowing down so that the paste material covers interfaces between an interposer substrate die or wiring layer and the semiconductor devices. The stress relief 511 may have an elastic modulus within a range of 2.0 GPa to 8.5 GPa.

The stress relief 511 may include a first horizontal extension 512 and a first vertical extension 513. The first vertical extension 513 may be formed integrally with the first horizontal extension 512.

In particular, the first horizontal extension 512 may extend between the first and second semiconductor devices 300, 400 and the interposer 200 to reinforce gaps between the first and second semiconductor devices 300, 400 and the interposer 200.

The first vertical extension 513 may be provided on the interposer 200 to fill gaps between the first and second semiconductor devices 300, 400 and the dummy die 50. The first vertical extension 513 may cover side surfaces of the first and second semiconductor devices 300, 400 and an inner surface of the dummy die 50. The first vertical extension 513 may fill a gap between the first semiconductor device 300 and the second semiconductor device 400. The first vertical extension 513 may fill gaps between lower outer surfaces of the first and second semiconductor devices 300, 400 and the entire inner surface of the dummy die 50.

An upper surface of the first vertical extension 513 may be lower than an upper surface of the second semiconductor device 400. An upper surface of the dummy die 50 may be exposed by the first vertical extension 513.

Figure 22:
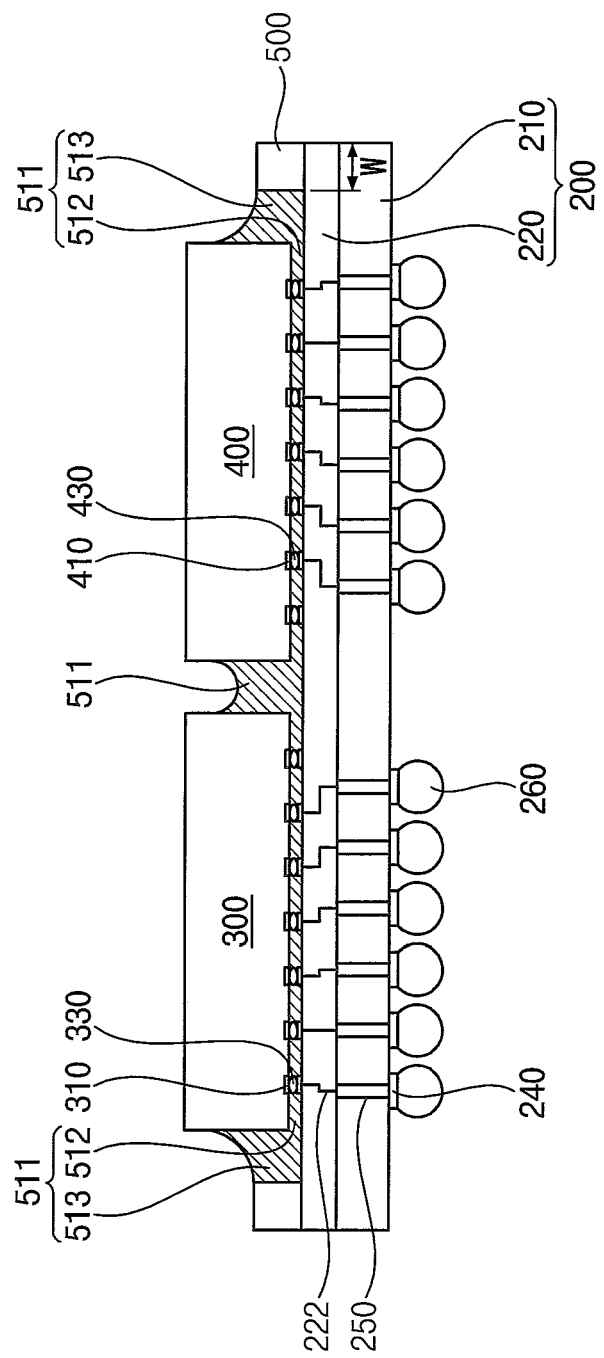

Referring to FIG. 22, the wafer W may be cut along the cutting region CR to form an individual interposer 200.

When the wafer W is sawed by a sawing process, a portion of the dummy die 50 in the cutting region CR may also be sawed to form a dam structure 500.

Thus, the first vertical extension 513 may serve as a stress relief 510 together with the first horizontal extension 512 to reduce stresses between the interfaces of different materials to thereby prevent occurrences of peeling or cracks. Further, the dam structure 500 may be provided to extend along the peripheral region of the interposer 200 to increase the overall rigidity of the interposer 200 to thereby reduce or prevent warpage.

Then, processes the same as or similar to the processes described with reference to FIGS. 15 and 16 may be performed to complete the semiconductor package 11 in FIG. 17.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present inventive concepts. Accordingly, all such modifications are intended to be included within the scope of example embodiments as defined in the claims.

What is claimed is:

1. A semiconductor package, comprising:
    an interposer;
    a plurality of semiconductor devices on the interposer and spaced apart from each other, the semiconductor devices being electrically connected to the interposer;
    a dam structure on the interposer extending along a peripheral region of the interposer, the dam structure being spaced apart from the semiconductor devices; and
    a stress relief structure on the interposer, the stress relief structure including an elastic member that fills gaps between the semiconductor devices and the dam structure, wherein an outer surface of the dam structure is coplanar with an outer surface of the interposer, and wherein a height of the dam structure is smaller than a height of the semiconductor devices.

2. The semiconductor package of claim 1, wherein a width of the dam structure is within a range of 200 μm to 400 μm.

3. The semiconductor package of claim 1, wherein a spacing distance between the semiconductor devices and the dam structure is within a range of 500 μm to 1,000 μm.

4. The semiconductor package of claim 1, wherein the elastic member has an elastic modulus within a range of 2.0 GPa to 8.5 GPa.

5. The semiconductor package of claim 1, wherein the elastic member includes an epoxy material.

6. The semiconductor package of claim 1, further comprising:
   a first underfill member between the semiconductor devices and the interposer.

7. The semiconductor package of claim 6, wherein the elastic member includes the same material as the first underfill member.

8. The semiconductor package of claim 6, wherein the stress relief structure has increased elasticity relative to the first underfill member.

9. The semiconductor package of claim 6, wherein the elastic member fills a gap between the semiconductor devices, and the elastic member covers lower outer surfaces of the semiconductor devices and a side surface of the first underfill member under the semiconductor devices.

10. The semiconductor package of claim 1, wherein the dam structure includes a silicon material.

11. A semiconductor package, comprising:
   an interposer, the interposer having a plurality of first and second bonding pads disposed respectively on a first surface and an opposite second surface of the interposer and electrically connected to each other;
   a plurality of semiconductor devices on the first surface of the interposer and spaced apart from each other, the semiconductor devices being electrically connected to the first bonding pads;
   a dam structure on the first surface of the interposer extending along a peripheral region of the interposer, the dam structure being spaced apart from the semiconductor devices; and
   a stress relief structure on the first surface of the interposer including an elastic member that fills gaps between the semiconductor devices and the dam structure,
   wherein an outer surface of the dam structure is coplanar with an outer surface of the interposer, and
   wherein a height of the dam structure is smaller than a height of the semiconductor devices.

12. The semiconductor package of claim 11, wherein a width of the dam structure is within a range of 200 μm to 400 μm.

13. The semiconductor package of claim 11, wherein a spacing distance between the semiconductor devices and the dam structure is within a range of 500 μm to 1,000 μm.

14. The semiconductor package of claim 11, further comprising:
   a first underfill member between the semiconductor devices and the first surface of the interposer.

15. The semiconductor package of claim 14, wherein the elastic member includes the same material as the first underfill member.

16. A semiconductor package, comprising:
   an interposer;
   a plurality of semiconductor devices on the interposer and spaced apart from each other;
   a dam structure on the interposer and extending along a peripheral region of the interposer, the dam structure being spaced apart from the semiconductor devices;
   a stress relief structure on the interposer including an elastic member that fills gaps between the semiconductor devices and the dam structure;
   a heat slug the heat slug covering and thermally contacting the semiconductor devices,
   wherein an outer surface of the dam structure is coplanar with an outer surface of the interposer,
   wherein a height of the dam structure is smaller than a height of the semiconductor devices, and
   wherein a width of the dam structure is within a range of 200 μm to 400 μm.

17. The semiconductor package of claim 16, wherein the dam structure includes a silicon material.

18. The semiconductor package of claim 16, wherein a spacing distance between the semiconductor devices and the dam structure is within a range of 500 μm to 1,000 μm.

19. The semiconductor package of claim 16, wherein the elastic member has an elastic modulus within a range of 2.0 GPa to 8.5 GPa.

20. The semiconductor package of claim 16, further comprising:
   a first underfill member between the semiconductor devices and the interposer,
   wherein the elastic member includes the same material as the first underfill member.

* * * * *